(12) United States Patent
Katrak et al.

(10) Patent No.: US 8,581,751 B2
(45) Date of Patent: Nov. 12, 2013

(54) MULTI-CELL VOLTAGE SECURE DATA ENCODING IN HYBRID VEHICLES

(75) Inventors: Kerfegar K. Katrak, Fenton, MI (US); Andrew H. Leutheuser, Royal Oak, MI (US); Scott A. Martin, Waterford, MI (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

(21) Appl. No.: 13/489,279

(22) Filed: Jun. 5, 2012

(65) Prior Publication Data

US 2012/0245793 A1    Sep. 27, 2012

Related U.S. Application Data

(62) Division of application No. 11/935,684, filed on Nov. 6, 2007, now Pat. No. 8,358,227.

(51) Int. Cl.
*H03M 7/00* (2006.01)
(52) U.S. Cl.
USPC .............................................. 341/50; 341/51
(58) Field of Classification Search
USPC ...................................................... 341/50, 51
See application file for complete search history.

(56) References Cited

U.S. PATENT DOCUMENTS

| | | | | |
|---|---|---|---|---|
| 5,438,607 A | * | 8/1995 | Przygoda et al. | 379/38 |
| 5,850,351 A | | 12/1998 | Lotfy et al. | |
| 6,226,200 B1 | * | 5/2001 | Eguchi et al. | 365/185.19 |
| 6,380,881 B2 | * | 4/2002 | Harada et al. | 341/165 |
| 7,205,915 B2 | * | 4/2007 | Zheltov et al. | 341/67 |
| 7,210,056 B2 | * | 4/2007 | Sandven et al. | 713/600 |
| 7,242,329 B2 | * | 7/2007 | Katrak | 341/97 |
| 7,453,378 B2 | * | 11/2008 | Narayanan | 341/51 |
| 7,573,754 B2 | * | 8/2009 | Kim et al. | 365/189.07 |
| 7,916,641 B2 | * | 3/2011 | Bourlas et al. | 370/235 |
| 2006/0232277 A1 | | 10/2006 | Murakami et al. | |
| 2007/0038917 A1 | | 2/2007 | Forest et al. | |
| 2007/0262890 A1 | * | 11/2007 | Cornwell et al. | 341/51 |
| 2008/0072135 A1 | * | 3/2008 | Cragun et al. | 715/230 |
| 2008/0157951 A1 | * | 7/2008 | Katrak et al. | 340/439 |
| 2008/0209310 A1 | * | 8/2008 | Cragun et al. | 715/230 |
| 2008/0288135 A1 | * | 11/2008 | Katrak et al. | 701/33 |
| 2009/0115653 A1 | * | 5/2009 | Katrak et al. | 341/173 |
| 2009/0273692 A1 | * | 11/2009 | Raynor et al. | 348/294 |
| 2010/0057282 A1 | * | 3/2010 | Katrak et al. | 701/22 |

OTHER PUBLICATIONS

Katrak, Kerfegar K., et al., Multi-Cell Voltage Secure Data Encoding in Hybrid Vehicles, U.S. Appl. No. 11/935,684, filed Nov. 6, 2007.

(Continued)

*Primary Examiner* — J. Allen Shriver, II
*Assistant Examiner* — Erez Gurari
(74) *Attorney, Agent, or Firm* — Ingrassia Fisher & Lorenz, P.C.

(57) ABSTRACT

Methods and systems are provided for encoding vehicle data comprising a first voltage pertaining to a first battery cell and a second voltage pertaining to a second battery cell is provided. A determination is made as to whether the first voltage is valid. In addition, a determination is made as to whether the second voltage is valid. One of a plurality of values is assigned to a validity measure based at least in part on whether the first voltage or the second voltage, or both, are valid. The plurality of values, in binary form, are at least two bit errors removed from one another.

20 Claims, 10 Drawing Sheets

(56) References Cited

OTHER PUBLICATIONS

U.S. Restriction Requirement, dated Sep. 27, 2011, issued in U.S. Appl. No. 11/935,684.

Response to U.S. Restriction Requirement, dated Oct. 27, 2011, filed in U.S. Appl. No. 11/935,684.

Ex parte Quayle Office Action, dated Dec. 12, 2011, issued in U.S. Appl. No. 11/935,684.

Response to Ex parte Quayle Office Action, dated Jan. 31, 2012, filed in U.S. Appl. No. 11/935,684.

German Office Action, dated Jan. 17, 2012, for German Patent Application No. 10 2008 054 354.3.

"Error Detection and Correction", Wikipedia definition. Retrieved on Oct. 30, 2007 from Internet: http://en.wikipedia.org/wiki/Error_detection_and_correction.

Notice of Allowance, dated Mar. 9, 2012, issued in U.S. Appl. No. 11/935,684.

Notice of Allowance, dated Sep. 17, 2012, issued in U.S. Appl. No. 11/935,684.

Notice of Allowance, dated Sep. 17, 2012, for U.S. Appl. No. 11/935,684.

* cited by examiner

MULTI-CELL VOLTAGE SECURE DATA ENCODING IN HYBRID VEHICLES

PRIORITY CLAIMS/CROSS-REFERENCES TO RELATED APPLICATIONS

This application is a division of, and claims priority to, U.S. application Ser. No. 11/935,684, filed on Nov. 6, 2007, which is incorporated herein by reference in its entirety.

TECHNICAL FIELD

The present invention generally relates to hybrid vehicles, and more particularly relates to methods and systems for encoding data pertaining to voltages of multiple cells in hybrid vehicles.

BACKGROUND OF THE INVENTION

Today's hybrid vehicles typically utilize a number of lithium ion battery cells to generate power. Information regarding voltages of the battery cells is generally transported between computer systems or processors along a vehicle bus within a hybrid vehicle, so that such information can then be interpreted and utilized within the hybrid vehicle. For example, if the voltage for a particular battery cell is higher than a desired voltage level, then the hybrid vehicle may utilize one or more cell balancing techniques to reduce the cell voltage closer to the desired voltage level.

The voltage information transported between computer systems or processors is often encoded prior to being transmitted along the vehicle bus. For example, a checksum may be utilized for voltage values to provide a level of encoding. However, it is often difficult to attain a desired level of encoding of the voltage information within a hybrid vehicle without significantly increasing the size and/or number of messages transmitted along the vehicle bus.

Accordingly, it is desirable to provide an improved method for encoding information regarding battery cell voltages in a hybrid vehicle, for example that provides improved encoding and/or that does not significantly increase the size and/or number of messages transmitted along the vehicle bus. It is also desired to provide an improved program for encoding information regarding battery cell voltages in a hybrid vehicle, for example that provides improved encoding and/or that does not significantly increase the size and/or number of messages transmitted along the vehicle bus. Furthermore, other desirable features and characteristics of the present invention will become apparent from the subsequent detailed description of the invention and the appended claims, taken in conjunction with the accompanying drawings and this background of the invention.

SUMMARY OF THE INVENTION

In accordance with an exemplary embodiment of the present invention, a method for encoding vehicle data comprising a first voltage pertaining to a first battery cell and a second voltage pertaining to a second battery cell is provided. The method comprises the steps of determining whether the first voltage is valid, determining whether the second voltage is valid, and assigning one of a plurality of values to a validity measure based at least in part on whether the first voltage or the second voltage, or both, are valid, wherein the plurality of values, in binary form, are at least two bit errors removed from one another.

In accordance with another exemplary embodiment of the present invention, a program product for encoding vehicle data comprising a first voltage pertaining to a first battery cell and a second voltage pertaining to a second battery cell is provided. The program product comprises a program and a non-transitory computer readable storage medium. The program is configured to at least facilitate determining whether the first voltage is valid, determining whether the second voltage is valid, and assigning one of a plurality of values to a validity measure based at least in part on whether the first voltage or the second voltage, or both, are valid, wherein the plurality of values, in binary form, are at least two bit errors removed from one another. The non-transitory, computer-readable storage medium stores the program.

In accordance with a further exemplary embodiment of the present invention, a system is provided for encoding vehicle data comprising a first voltage pertaining to a first battery cell and a second voltage pertaining to a second battery cell. The system comprises a measurement unit and a processor. The measurement unit is configured to obtain the first voltage and the second voltage. The processor is coupled to the measurement unit, and is configured to at least facilitate determining whether the first voltage is valid, determining whether the second voltage is valid, and assigning one of a plurality of values to a validity measure based at least in part on whether the first voltage or the second voltage, or both, are valid, wherein the plurality of values, in binary form, are at least two bit errors removed from one another.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
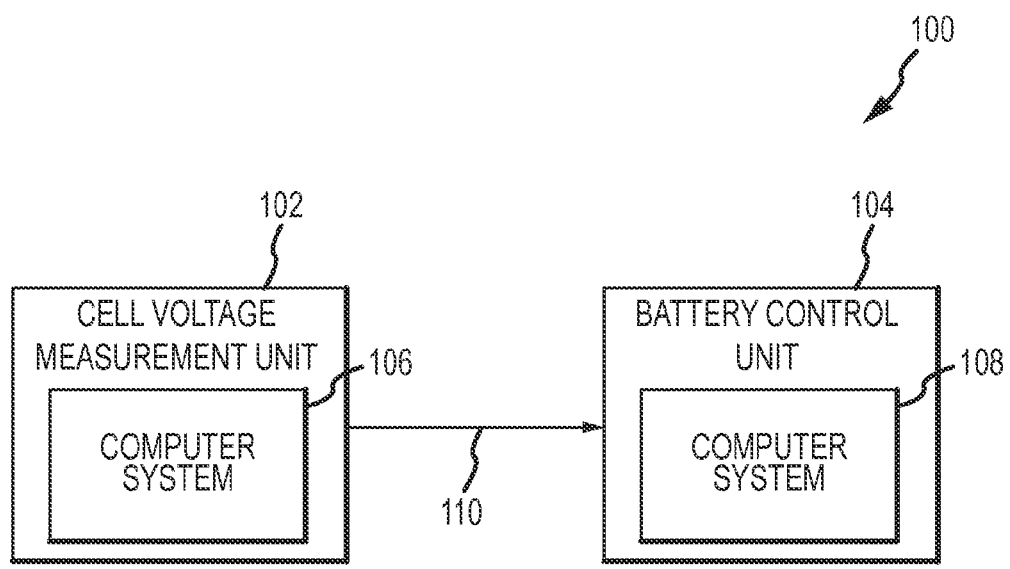
FIG. 1 is a functional block diagram of a communications system in a hybrid vehicle for processing data pertaining to voltages of a plurality of battery cells in the hybrid vehicle, in accordance with an exemplary embodiment of the present invention.

FIG. 1 is a functional block diagram of a communications system 100 in a hybrid vehicle for processing data pertaining to voltages of a plurality of battery cells in the hybrid vehicle, in accordance with an exemplary embodiment of the present invention. In the depicted embodiment, the communications system 100 includes a cell voltage measurement unit 102 and a battery control unit 104.

The cell voltage measurement unit 102 and the battery control unit 104 are coupled, and are preferably interconnected, by a conventional data connection 110 as appropriate. In various embodiments, the data connection 110 is a UART or other internal connection (e.g. a bus connection) within the communications system 100. The cell voltage measurement unit 102 generates encoded data messages pertaining to voltage values of a plurality of battery cells in the hybrid vehicle, and transports the encoded data messages to the battery control unit 104 across the data connection 110. The battery control unit 104 receives the encoded data messages, interprets the encoded data messages, and provides instructions as to any required remedial action based on the encoded data messages. An exemplary embodiment of a voltage data processing process for generating and encoding such data messages will be discussed further below in connection with FIG. 3.

As depicted in FIG. 1, the cell voltage measurement unit 102 and the battery control unit 104 preferably include respective computer systems 106, 108. An exemplary embodiment of a computer system, which can be used for the computer systems 106 and 108 of the cell voltage measurement unit 102 and the second battery control unit 104, respectively, will be discussed below in connection with FIG. 2. In a preferred embodiment, the cell voltage measurement unit 102 and the battery control unit 104 use different computer systems 106, 108. However, it will be appreciated that, in various other embodiments, the cell voltage measurement unit 102 and the battery control unit 104 may use one or more common computer systems. It will similarly be appreciated that the communications system 100 can be utilized in connection with any number of different types of computer systems and/or other devices or systems in various embodiments.

Figure 2:
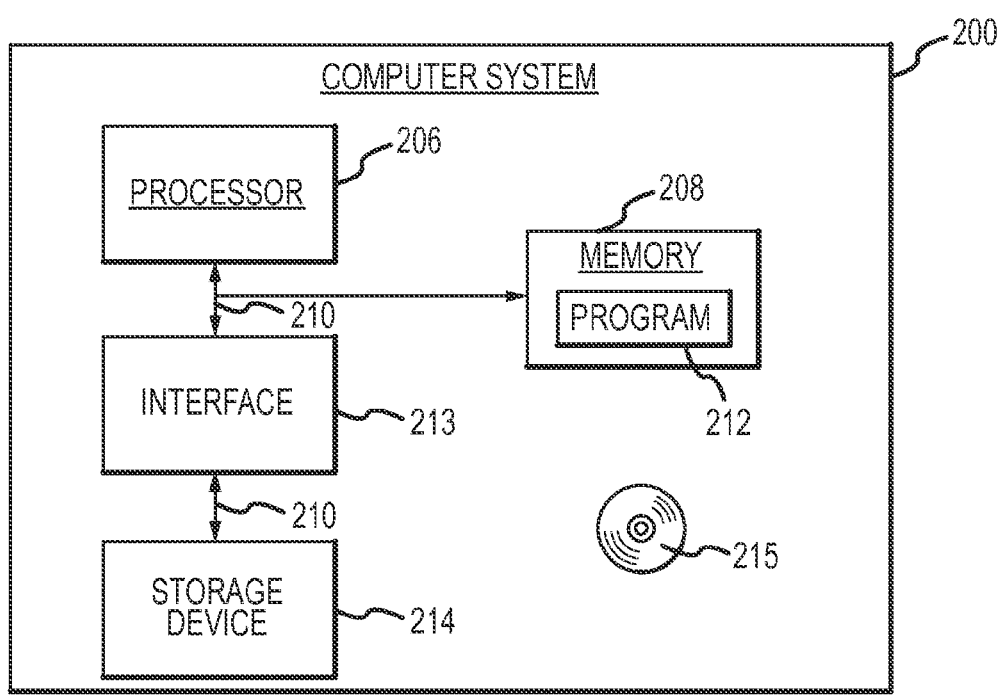
FIG. 2 is a functional block diagram of a computer system that can be utilized in connection with the communications system of FIG. 1, in accordance with an exemplary embodiment of the present invention.

FIG. 2 is a functional block diagram of a computer system 200 that can be used in connection with the above-referenced respective computer systems 106, 108 of the cell voltage measurement unit 102 and the battery control unit 104 of the communications system 100 of FIG. 1, and that can be utilized in implementing the voltage data processing process described further below in connection with FIG. 3 and other processes and steps described herein, in accordance with an exemplary embodiment of the present invention. In one preferred embodiment, each of the cell voltage measurement unit 102 and the battery control unit 104 of FIG. 1 uses a different computer system 200. However, similar to the discussion above in connection with FIG. 1, this may vary in other embodiments.

In the embodiment depicted in FIG. 2, each computer system 200 includes a processor 206, a memory 208, a computer bus 210, an interface 213, and a storage device 214. The processor 206 performs the computation and control functions of the cell voltage measurement unit 102 and/or the battery control unit 104 or portions thereof, and may comprise any type of processor or multiple processors, single integrated circuits such as a microprocessor, or any suitable number of integrated circuit devices and/or circuit boards working in cooperation to accomplish the functions of a processing unit. During operation, the processor 206 executes one or more programs 212 preferably stored within the memory 208 and, as such, controls the general operation of the computer system 200.

The memory 208 stores a program or programs 212 that executes one or more embodiments of a voltage data processing process such as that described further below in connection with FIG. 3, and/or various steps thereof and/or other processes, such as those described elsewhere herein. The memory 208 can be any type of suitable memory. This would include the various types of dynamic random access memory (DRAM) such as SDRAM, the various types of static RAM (SRAM), and the various types of non-volatile memory (PROM, EPROM, and flash). It should be understood that the memory 208 may be a single type of memory component, or it may be composed of many different types of memory components. In addition, the memory 208 and the processor 206 may be distributed across several different computers that collectively comprise the computer system 200. For example, a portion of the memory 208 may reside on a computer within a particular apparatus or process, and another portion may reside on a remote computer.

The computer bus 210 serves to transmit programs, data, status and other information or signals between the various components of the computer system 200. The computer bus 210 can be any suitable physical or logical means of connecting computer systems and components. This includes, but is not limited to, direct hard-wired connections, fiber optics, infrared and wireless bus technologies.

The interface 213 allows communication to the computer system 200, for example from a system operator and/or another computer system, and can be implemented using any suitable method and apparatus. It can include one or more network interfaces to communicate within the communications system 100 of FIG. 1 and/or within or to other systems or components, one or more terminal interfaces to communicate with technicians, and one or more storage interfaces to connect to storage apparatuses such as the storage device 214.

The storage device 214 can be any suitable type of storage apparatus, including direct access storage devices such as hard disk drives, flash systems, floppy disk drives and optical disk drives. In one exemplary embodiment, the storage device 214 is a program product from which memory 208 can receive a program 212 that executes one or more embodiments of a voltage data processing process of the present invention, and/or steps thereof. In one preferred embodiment, such a program product can be implemented as part of, inserted into, or otherwise coupled to the computer systems 106, 108 of the cell voltage measurement unit 102 and the battery control unit 104, respectively, of the communications system 100 of FIG. 1. As shown in FIG. 2, the storage device 214 can comprise a disk drive device that uses disks 215 to store data. As one exemplary implementation, the computer system 200 may also utilize an Internet website, for example for providing or maintaining data or performing operations thereon.

It will be appreciated that while this exemplary embodiment is described in the context of a fully functioning computer system, those skilled in the art will recognize that the mechanisms of the present invention are capable of being distributed as a program product in a variety of forms, and that the present invention applies equally regardless of the particular type of computer-readable signal bearing media used to carry out the distribution. Examples of signal bearing media include: recordable media such as floppy disks, hard drives, memory cards and optical disks (e.g., disk 215), and transmission media such as digital and analog communication links. It will similarly be appreciated that the computer system 200 may also otherwise differ from the embodiment depicted in FIG. 2, for example in that the computer system 200 may be coupled to or may otherwise utilize one or more remote computer systems and/or other control systems.

Figure 3:
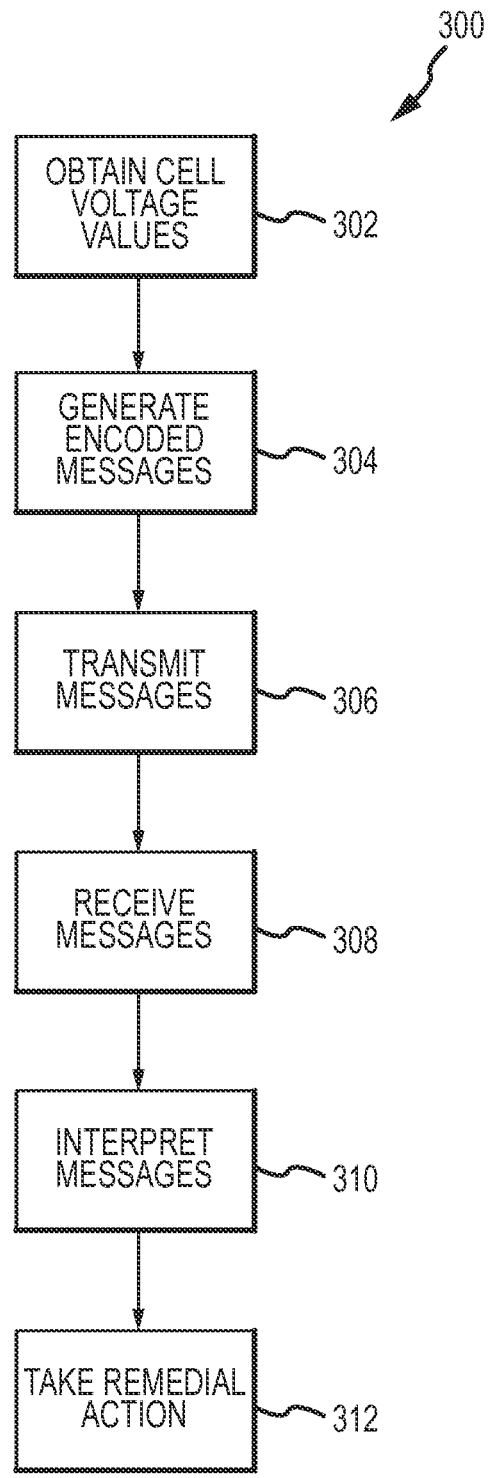
FIG. 3 is a flowchart depicting a process for processing data pertaining to voltages of a plurality of battery cells in a hybrid vehicle, for example that can be used in connection with the communications system of FIG. 1 and the computer system of FIG. 2, in accordance with an exemplary embodiment of the present invention.

FIG. 3 is a flowchart depicting a voltage data processing process 300 for processing data pertaining to voltages of a plurality of battery cells in a hybrid vehicle. In a preferred embodiment, the voltage data processing process 300 can be utilized in connection with the communications system 100 of FIG. 1 and the computer system 204 of FIG. 2. However, it will be appreciated that the voltage data processing process 300 can also be utilized in connection with any number of other different types of systems and/or devices.

As depicted in FIG. 3, the voltage data processing process 300 begins with the step of obtaining voltage values (step 302). In a preferred embodiment, voltage values are obtained for each battery cell in the hybrid vehicle. Next, a plurality of encoded data messages are generated from the voltage values (step 304). In a preferred embodiment, the encoded data messages are generated using the computer system 106 of the cell voltage measurement unit 102 of FIG. 1. An exemplary embodiment of a process for generating the encoded data messages is depicted in FIG. 4 and will be described further below in connection therewith.

The encoded data messages are then transmitted (step 306), preferably from the cell voltage measurement unit 102 of FIG. 1 along the data connection 110 of FIG. 1. Subsequently the encoded data messages are received (step 308), preferably by the second battery control unit 104 of FIG. 1. Upon receipt, the encoded data messages are then interpreted (step 310), preferably using the computer system 108 of the second battery control unit 104 of FIG. 1. Remedial action, if appropriate, is then undertaken (step 312). In a preferred embodiment, the remedial action is taken based at least in part on instructions provided by the computer system 108 of the second battery control unit 104 of FIG. 1, based upon the interpretation of the encoded data messages. For example, if there is an indication of a problem with one or more voltage values in the encoded data messages, then such remedial action may include utilizing previous voltage values from previous encoded messages.

Figure 4:
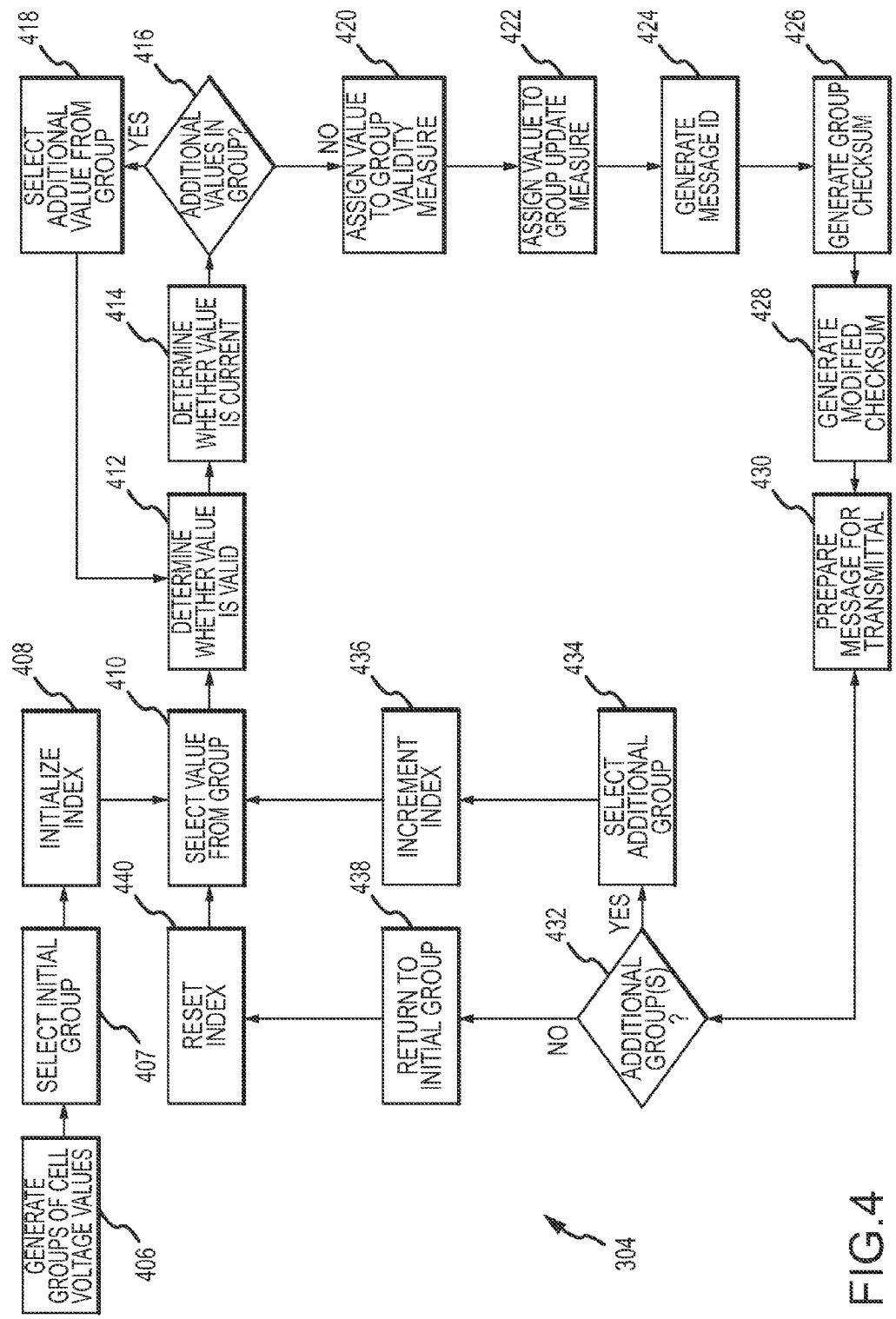
FIG. 4 is a flowchart depicting a step of the process of FIG. 3, namely a step of generating encoded data messages pertaining to cell voltage values.

FIG. 4 is a flowchart depicting a step of the voltage data encoding process 300 of FIG. 3, namely the step of generating encoded data messages (step 304) (hereafter also referred to as the voltage data encoding process 304). In this voltage data encoding process 304, encoded data is generated pertaining to voltages of a plurality of battery cells in a hybrid vehicle, in accordance with an exemplary embodiment of the present invention. In a preferred embodiment, the voltage data encoding process 304 can be utilized in connection with the communications system 100 of FIG. 1 and the computer system 204 of FIG. 2. However, it will be appreciated that the voltage data encoding process 304 can also be utilized in connection with any number of other different types of systems and/or devices, and can also be utilized in connection with any number of other different processes and/or steps thereof.

As depicted in FIG. 4, the voltage data encoding process 304 begins with the step of generating groups of cell voltage values (step 406). Preferably, in this step, the cell voltage values previously obtained in step 302 of FIG. 3 are divided into voltage groups according to which battery cells they pertain to. In one exemplary embodiment, each voltage group comprises three cell voltage values, with each cell voltage value pertaining to a different battery cell. In another exemplary embodiment, each voltage group comprises four cell voltage values, with each cell voltage value pertaining to a different battery cell. In various other embodiments, the voltage groups may similarly comprise any number of different cell voltage values.

One of the voltage groups is then selected for inclusion in a data message (step 407), and an index is initialized for this voltage group (step 408). A voltage value is then selected from the voltage group (step 410). The selected voltage value represents a voltage value from one of the battery cells represented in the voltage group.

A determination is then made as to whether the selected voltage value is valid (step 412). For example, in a preferred embodiment, the selected voltage value is determined to be invalid if the selected voltage value does not represent a possible voltage value for a corresponding battery cell, or if the selected voltage value reflects such a significant change from a previous voltage value that it is highly unlikely to have occurred without an error, or if there is some other reason not to trust the selected voltage value. In a preferred embodiment, this determination, and the various other determinations and calculations of the voltage data encoding process 304, is performed by the computer system 106 of the cell voltage measurement unit 102 of FIG. 1, specifically by a processor thereof such as the processor 206 depicted in FIG. 2.

In addition, a determination is made as to whether the selected voltage value is current (step 414). In a preferred embodiment, the selected voltage value is determined to be current if the selected voltage value represents a current, updated voltage value for the corresponding battery cell. For example, if the voltage value for the corresponding battery cell has been updated since the time a previous message had been generated that included the voltage value for the corresponding battery cell, then the selected voltage value will be determined to be current, in a preferred embodiment. Conversely, if the voltage value for the corresponding battery cell has not been updated since the time a previous message had been generated that included the voltage value for the corresponding battery cell (for example, if the voltage value represents a prior value, such as from a prior iteration and/or a prior data message), then the selected voltage value will be determined to be not current in this preferred embodiment.

The process continues with a determination as to whether there are any additional voltage values in the voltage group to be analyzed for inclusion in the data message (step 416). Specifically, a determination is made as to whether voltage values pertaining to any additional corresponding battery cells represented in the voltage group have yet to be analyzed for validity and currency for inclusion in the data message.

If a determination is made that there are additional voltage values to be analyzed for inclusion in the data message, then an additional voltage value is selected from the voltage group (step 418). The selected additional voltage value represents a voltage value from an additional battery cell represented in the voltage group. The process then returns to step 412 in a new iteration, and determinations are made as to whether the selected additional voltage value is valid (step 412) and as to whether the selected additional voltage value is current (step 414), after which a new determination is made as to whether there are any other additional voltage values in the voltage group to be analyzed for inclusion in the data message (step 416). Steps 412-416 repeat in this manner through various iterations until a determination is made in an iteration of step 416 that there are no additional voltage values in the voltage group to be analyzed for inclusion in the data message.

Once it is determined in an iteration of step 416 that there are no additional voltage values in the voltage group to be analyzed for inclusion in the data message (that is, once each voltage value in the voltage group has been analyzed for validity and currency in iterations of steps 412 and 414), then a value is assigned to a group validity measure (step 420). The group validity measure is assigned a value based on the determinations made in various iterations of step 412 regarding the validity of the different voltage values in the voltage group.

In a preferred embodiment, the group validity measure is assigned one of a plurality of values based at least in part on which, if any, of the voltage values in the voltage group are valid and which, if any, of the voltage values in the voltage group are invalid. In a preferred embodiment, the plurality of values comprises a set of Karnaugh values such that each of the plurality of values, in binary form, are at least two bit (binary digit) errors removed from one another. The use of such a set of Karnaugh values helps to minimize the likelihood of an error in the assigned value for the group validity measure. For example, a single bit error in the group validity measure can be relatively easy to detect, because such a single bit error would result in a value for the group validity measure that is not a member of the set of Karnaugh values for the group validity measure.

Figure 5:
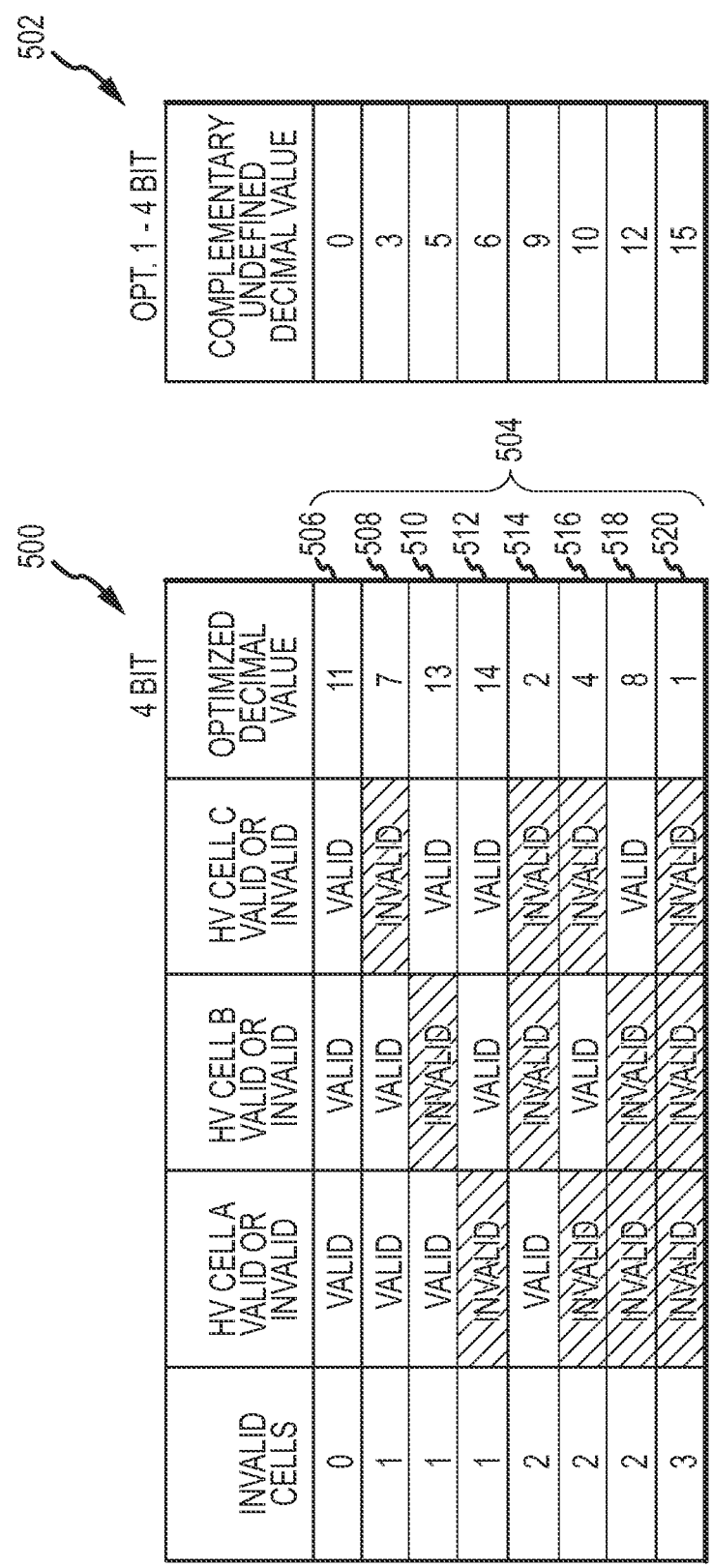
FIG. 5 is a table of values that can be assigned to a validity measure that can be used in the step of FIG. 4, in accordance with an exemplary embodiment of the present invention.

For example, FIG. 5 depicts an exemplary embodiment of a table 500 of a set of Karnaugh values that can be used as a plurality of values 504 for the group validity measure for a voltage group comprising voltage values for three different battery cells (referenced in FIG. 5 as Cell A, Cell B, and Cell C). In a preferred embodiment for such a voltage group representing three different battery cells, the group validity measure is assigned (1) a first value 506 from the plurality of values 504 if the voltage values from Cell A, Cell B, and Cell C each are valid; (2) a second value 508 from the plurality of values 504 if the voltage values from Cell A and Cell B each are valid and the voltage value from Cell is invalid; (3) a third value 510 from the plurality of values 504 if the voltage values from Cell A and Cell C each are valid and the voltage value from Cell B is invalid; (4) a fourth value 512 from the plurality of values 504 if the voltage value from Cell A is invalid and the voltage values from Cell B and Cell C each are valid; (5) a fifth value 514 from the plurality of values 504 if the voltage value from Cell A is valid and the voltage values from Cell B and Cell C each are invalid; (6) a sixth value 516 from the plurality of values 504 if the voltage values from Cell A and Cell C each are invalid and the voltage value from Cell B is valid; (7) a seventh value 518 from the plurality of values 504 if the voltage values from Cell A and Cell B each are invalid and the voltage value from Cell C is valid; and (8) an eighth value 520 from the plurality of values 504 if the voltage values from Cell A, Cell B, and Cell C each are invalid.

In the depicted embodiment of FIG. 5, the first value 506 is equal to eleven, the second value 508 is equal to seven, the third value 510 is equal to thirteen, the fourth value 512 is equal to fourteen, the fifth value 514 is equal to two, the sixth value 516 is equal to four, the seventh value 518 is equal to eight, and the eighth value 520 is equal to one. These eight values form a Karnaugh set of values, each of which are at least two bit errors removed from one another in binary form. In other embodiments, different sets of Karnaugh values may also be used.

Figure 6:
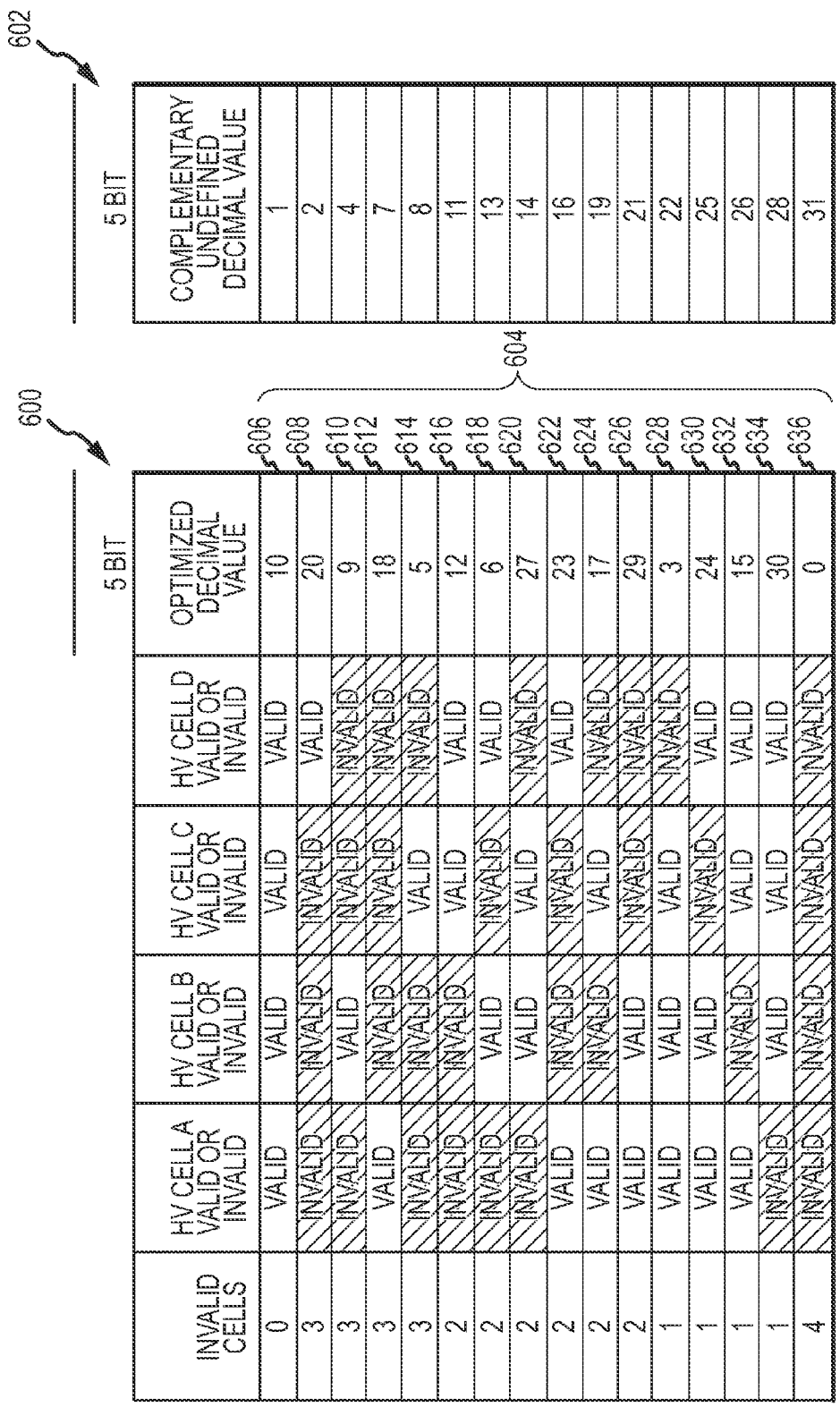
FIG. 6 is an alternative table of values that can be assigned to a validity measure that can be used in the step of FIG. 4, in accordance with an exemplary embodiment of the present invention.

As another example, FIG. 6 depicts an exemplary embodiment of another table 600 of a set of Karnaugh values that can be used as a plurality of values 604 for the group validity measure for a voltage group comprising voltage values for four different battery cells (referenced in FIG. 6 as Cell A, Cell B, Cell C, and Cell D). In a preferred embodiment for such a voltage group representing four different battery cells, the group validity measure is assigned (1) a first value 606 from the plurality of values 604 if the voltage values from Cell A, Cell B, Cell C, and Cell D each are valid; (2) a second value 608 from the plurality of values 604 if the voltage values from Cell A, Cell B, and Cell C each are invalid and the voltage value for Cell D is valid; (3) a third value 610 from the plurality of values 604 if the voltage values from Cell A, Cell C, and Cell D each are invalid and the voltage value for Cell B is valid; (4) a fourth value 612 from the plurality of values 604 if the voltage value from Cell A is valid and the voltage values from Cell B, Cell C, and Cell D each are invalid; (5) a fifth value 614 from the plurality of values 604 if the voltage values from Cell A, Cell B, and Cell D each are invalid and the voltage value for Cell C is valid; (6) a sixth value 616 from the plurality of values 604 if the voltage values from Cell A and Cell B each are invalid and the voltage values from Cell C and Cell D each are valid; (7) a seventh value 618 from the plurality of values 604 if the voltage values from Cell A and Cell C each are invalid and the voltage values from Cell B and Cell D each are valid; (8) an eighth value 620 from the plurality of values 604 if the voltage values from Cell A and Cell D each are invalid and the voltage values from Cell B and Cell C each are valid; (9) a ninth value 622 from the plurality of values 604 if the voltage values from Cell A and Cell D each are valid and the voltage values from Cell B and Cell C each are invalid; (10) a tenth value 624 from the plurality of values 604 if the voltage values from Cell A and Cell C each are valid and the voltage values from Cell B and Cell D each are invalid; (11) an eleventh value 626 from the plurality of values 604 if the voltage values from Cell A and Cell B each are valid and the voltage values from Cell C and Cell D each are invalid; (12) a twelfth value 628 from the plurality of values 604 if the voltage values from Cell A, Cell B, and Cell C each are valid and the voltage value from Cell D is invalid; (13) a thirteenth value 630 from the plurality of values 604 if the voltage values from Cell A, Cell B, and Cell D each are valid and the voltage value from Cell C is invalid; (14) a fourteenth value 632 from the plurality of values 604 if the voltage values from Cell A, Cell C, and Cell D each are valid and the voltage value from Cell B is invalid; (15) a fifteenth value 634 from the plurality of values 604 if the voltage values from Cell B, Cell C, and Cell D each are valid and the voltage value from Cell A is invalid, and (16) a sixteenth value 636 from the plurality of values 604 if the voltage values from Cell A, Cell B, Cell C, and Cell D each are invalid.

In the depicted embodiment of FIG. 6, the first value 606 is equal to ten, the second value 608 is equal to twenty, the third value 610 is equal to nine, the fourth value 612 is equal to eighteen, the fifth value 614 is equal to five, the sixth value 616 is equal to twelve, the seventh value 618 is equal to six, the eighth value 620 is equal to twenty-seven, the ninth value 622 is equal to twenty-three, the tenth value 624 is equal to seventeen, the eleventh value 626 is equal to twenty-nine, the twelfth value 628 is equal to three, the thirteenth value 630 is equal to twenty-four, the fourteenth value 632 is equal to fifteen, the fifteenth value 634 is equal to thirty, and the sixteenth value 636 is equal to zero. These sixteen values form a Karnaugh set of values, each of which are at least two bit errors removed from one another in binary form. In other embodiments, different sets of Karnaugh values may also be used.

Also in certain preferred embodiments, such as those depicted in FIGS. 5 and 6 above, values assigned for the group validity measure for scenarios in which relatively more of the voltage values are valid are at least as secure as those values assigned for scenarios in which relatively fewer of the voltage values are valid. For example, the closer the scenario is to having all voltage values being valid, the relatively more important each battery cell value may be deemed to be, in terms of potential corrective action. Accordingly, in such relatively more important scenarios, the group validity measure is preferably assigned a value with at least as many (and preferably more) alternating zeros and ones, and/or a value with a relatively larger number of one values (assuming that the data connection 110 assigns values to zero as a default value) as compared with scenarios that are deemed to be of relatively less importance, in order to provide further enhanced security for the relatively more important scenarios. However, in other embodiments, this may vary.

In addition, when the data message is ultimately received and interpreted, for example by the battery control unit 104 of FIG. 1, the group validity measure can then be compared with a set of complementary validity values stored in the battery control unit 104 (preferably in a memory 208 thereof such as is depicted in FIG. 2). The set of complementary validity values comprises a set of values that are one bit error removed from the plurality of values used for the group validity measure. Accordingly, the complementary validity values can be used to easily identify whether a single bit error has occurred in connection with the group update measure. For example, in the exemplary embodiment of the plurality of values 504 of FIG. 5, a set of complementary validity values 502 includes the numbers zero, three, five, six, nine, ten, twelve, and fifteen, each of which is one bit error removed from one or more of the plurality of values 504 depicted in FIG. 5. Similarly, in the exemplary embodiment of the plurality of values 604 of FIG. 6, a set of complementary validity values 602 includes the numbers one, two, four, seven, eight, eleven, thirteen, fourteen, sixteen, nineteen, twenty one, twenty two, twenty five, twenty six, twenty eight, and thirty one, each of which is one bit error removed from one or more of the plurality of values 604 depicted in FIG. 6.

In addition, and returning back to FIG. 4, a group update measure is assigned (step 422). The group update measure is assigned based on the determinations made in various iterations of step 414 regarding the currency of the different voltage values.

In a preferred embodiment, the group update measure is assigned one of a plurality of values based at least in part on which, if any, of the voltage values in the voltage group are current and which, if any, of the voltage values in the voltage group are not current. In a preferred embodiment, the plurality of values comprises a set of Karnaugh values such that each of the plurality of values, in binary form, are at least two bit (binary digit) errors removed from one another. The use of such a set of Karnaugh values helps to minimize the likelihood of an error in the assigned value for the group update measure. For example, a single bit error in the group update measure can be relatively easy to detect, because such a single bit error would result in a value for the group update measure that is not a member of the set of Karnaugh values for the group update measure.

Figure 7:
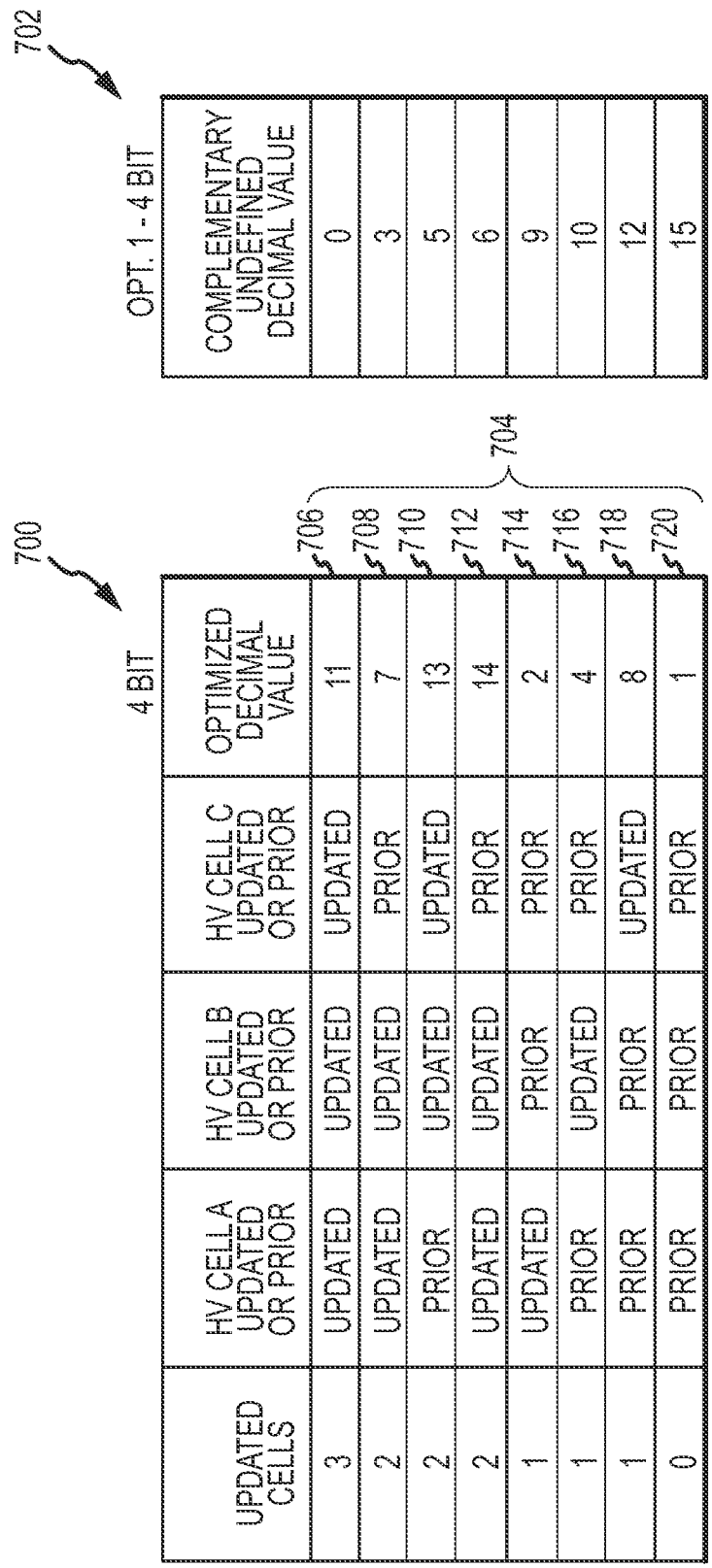
FIG. 7 is a table of values that can be assigned to an update measure that can be used in the step of FIG. 4, in accordance with an exemplary embodiment of the present invention.

For example, FIG. 7 depicts an exemplary embodiment of a table 700 of a set of Karnaugh values that can be used as a plurality of values 704 for the group update measure for a voltage group comprising voltage values for three different battery cells (referenced in FIG. 7 as Cell A, Cell B, and Cell C). In a preferred embodiment for such a voltage group representing three different battery cells, the group update measure is assigned (1) a first value 706 from the plurality of values 704 if the voltage values from Cell A, Cell B, and Cell C each are current (i.e. labeled as prior, or not updated, in FIG. 7); (2) a second value 708 from the plurality of values 704 if the voltage values from Cell A and Cell B each are current and the voltage value from Cell is not current (i.e. labeled as updated in FIG. 7); (3) a third value 710 from the plurality of values 704 if the voltage values from Cell B and Cell C each are current and the voltage value from Cell A is not current; (4) a fourth value 712 from the plurality of values 704 if the voltage value from Cell C is not current and the voltage values from Cell A and Cell B each are current; (5) a fifth value 714 from the plurality of values 704 if the voltage value from Cell A is current and the voltage values from Cell B and Cell C each are not current; (6) a sixth value 716 from the plurality of values 704 if the voltage values from Cell A and Cell C each are not current and the voltage value from Cell B is current; (7) a seventh value 718 from the plurality of values 704 if the voltage values from Cell A and Cell B each are not current and the voltage value from Cell C is current; and (8) an eighth value 720 from the plurality of values 704 if the voltage values from Cell A, Cell B, and Cell C each are not current.

In the depicted embodiment of FIG. 7, the first value 706 is equal to eleven, the second value 708 is equal to seven, the third value 710 is equal to thirteen, the fourth value 712 is equal to fourteen, the fifth value 714 is equal to two, the sixth value 716 is equal to four, the seventh value 718 is equal to eight, and the eighth value 720 is equal to one. These eight values form a Karnaugh set of values, each of which are at least two bit errors removed from one another in binary form. In other embodiments, different sets of Karnaugh values may also be used.

Figure 8:
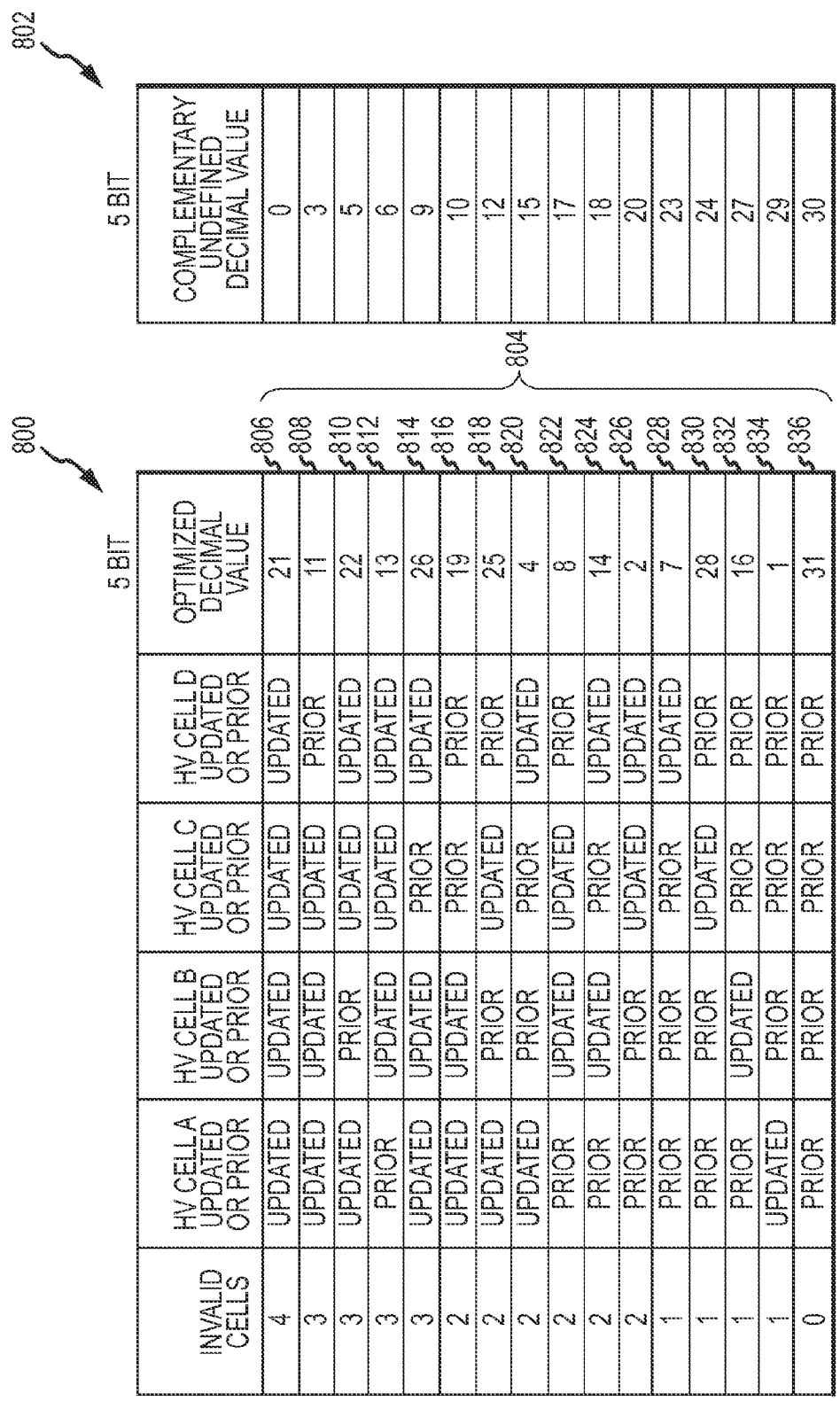
FIG. 8 is an alternative table of values that can be assigned to an update measure that can be used in the step of FIG. 4, in accordance with an exemplary embodiment of the present invention.

As another example, FIG. 8 depicts an exemplary embodiment of another table 800 of a set of Karnaugh values that can be used as a plurality of values 804 for the group update measure for a voltage group comprising voltage values for four different battery cells (referenced in FIG. 8 as Cell A, Cell B, Cell C, and Cell D). In a preferred embodiment for such a voltage group representing four different battery cells, the group update measure is assigned (1) a first value 806 from the plurality of values 804 if the voltage values from Cell A, Cell B, Cell C, and Cell D each are current (labeled as updated in FIG. 8); (2) a second value 808 from the plurality of values 804 if the voltage values from Cell A, Cell B, and Cell C each are current and the voltage value for Cell D is not current (labeled as prior, or not updated, in FIG. 8); (3) a third value 810 from the plurality of values 804 if the voltage values from Cell A, Cell C, and Cell D each are current and the voltage value for Cell B is not current; (4) a fourth value 812 from the plurality of values 804 if the voltage value from Cell A is not current and the voltage values from Cell B, Cell C, and Cell D each are current; (5) a fifth value 814 from the plurality of values 804 if the voltage values from Cell A, Cell B, and Cell D each are current and the voltage value for Cell C is not current; (6) a sixth value 816 from the plurality of values 804 if the voltage values from Cell A and Cell B each are current and the voltage values from Cell C and Cell D each are not current; (7) a seventh value 818 from the plurality of values 804 if the voltage values from Cell A and Cell C each are current and the voltage values from Cell B and Cell D each are not current; (8) an eighth value 820 from the plurality of values 804 if the voltage values from Cell A and Cell D each are current and the voltage values from Cell B and Cell C each are not current; (9) a ninth value 822 from the plurality of values 804 if the voltage values from Cell A and Cell D each are not current and the voltage values from Cell B and Cell C each are current; (10) a tenth value 824 from the plurality of values 804 if the voltage values from Cell A and Cell C each are not current and the voltage values from Cell B and Cell D each are current; (11) an eleventh value 826 from the plurality of values 804 if the voltage values from Cell A and Cell B each are not current and the voltage values from Cell C and Cell D each are current; (12) a twelfth value 828 from the plurality of values 804 if the voltage values from Cell A, Cell B, and Cell C each are not current and the voltage value from Cell D is current; (13) a thirteenth value 830 from the plurality of values 804 if the voltage values from Cell A, Cell B, and Cell D each are not current and the voltage value from Cell C is current; (14) a fourteenth value 832 from the plurality of values 804 if the voltage values from Cell A, Cell C, and Cell D each are not current and the voltage value from Cell B is current; (15) a fifteenth value 834 from the plurality of values 804 if the voltage values from Cell B, Cell C, and Cell D each are not current and the voltage value from Cell A is current, and (16) a sixteenth value 836 from the plurality of values 804 if the voltage values from Cell A, Cell B, Cell C, and Cell D each are not current.

In the depicted embodiment of FIG. 8, the first value 806 is equal to twenty one, the second value 808 is equal to eleven, the third value 810 is equal to twenty two, the fourth value 812 is equal to thirteen, the fifth value 814 is equal to twenty six, the sixth value 816 is equal to nineteen, the seventh value 818 is equal to twenty five, the eighth value 820 is equal to four, the ninth value 822 is equal to eight, the tenth value 824 is equal to fourteen, the eleventh value 826 is equal to two, the twelfth value 828 is equal to seven, the thirteenth value 830 is equal to twenty eight, the fourteenth value 832 is equal to sixteen, the fifteenth value 834 is equal to one, and the sixteenth value 836 is equal to thirty one. These sixteen values form a Karnaugh set of values, each of which are at least two bit errors removed from one another in binary form. In other embodiments, different sets of Karnaugh values may also be used.

Also in certain preferred embodiments, such as those depicted in FIGS. 7 and 8 above, values assigned for the group update measure for scenarios in which relatively more of the voltage values are current are at least as secure as those values assigned for scenarios in which relatively fewer of the voltage values are current. For example, the closer the scenario is to having all voltage values being current, the relatively more important each battery cell value may be deemed to be, in terms of potential corrective action. Accordingly, in such relatively more important scenarios, the group update measure is preferably assigned a value with at least as many (and preferably more) alternating zeros and ones, and/or a value with a relatively larger number of one values (assuming that the data connection 110 assigns values to zero as a default value) as compared with scenarios that are deemed to be of less importance, in order to provide further enhanced security for the relatively more important scenarios. However, in other embodiments, this may vary.

In addition, when the data message is ultimately received and interpreted, for example by the battery control unit 104 of FIG. 1, the group update measure can then be compared with a set of complementary update values stored in the battery control unit 104 (preferably in a memory 208 thereof such as is depicted in FIG. 2). The set of complementary update values comprises a set of values that are one bit error removed from the plurality of values used for the group update measure. Accordingly, the complementary update values can be used to easily identify whether a single bit error has occurred in connection with the group update measure. For example, in the exemplary embodiment of the plurality of values 704 of FIG. 7, a set of complementary update values 702 includes the numbers zero, three, five, six, nine, ten, twelve, and fifteen, each of which is one bit error removed from one or more of the plurality of values 704 depicted in FIG. 7. Similarly, in the exemplary embodiment of the plurality of values 804 of FIG. 8, a set of complementary update values 802 includes the numbers zero, three, five, six, nine, ten, twelve, fifteen, seventeen, eighteen, twenty, twenty three, twenty four, twenty seven, twenty nine, and thirty, each of which is one bit error removed from one or more of the plurality of values 804 depicted in FIG. 8.

Returning again to FIG. 4, a message identifier is generated (step 424). In a preferred embodiment, the message identifier informs the second battery control unit 104 of FIG. 1 receiving the data message that the data message is intended to be interpreted by this second battery control unit 104. Next, an initial checksum (also referred to herein as a group checksum) is generated for the various voltage values in the voltage group (step 426), using techniques known in the art. A modified checksum is then generated based upon the message identification and the group checksum (step 428). In a preferred embodiment, the modified checksum is generated by subtracting the message identifier from the group checksum, in order to help to minimize the number of binary digits required for the modified checksum.

Figure 9:
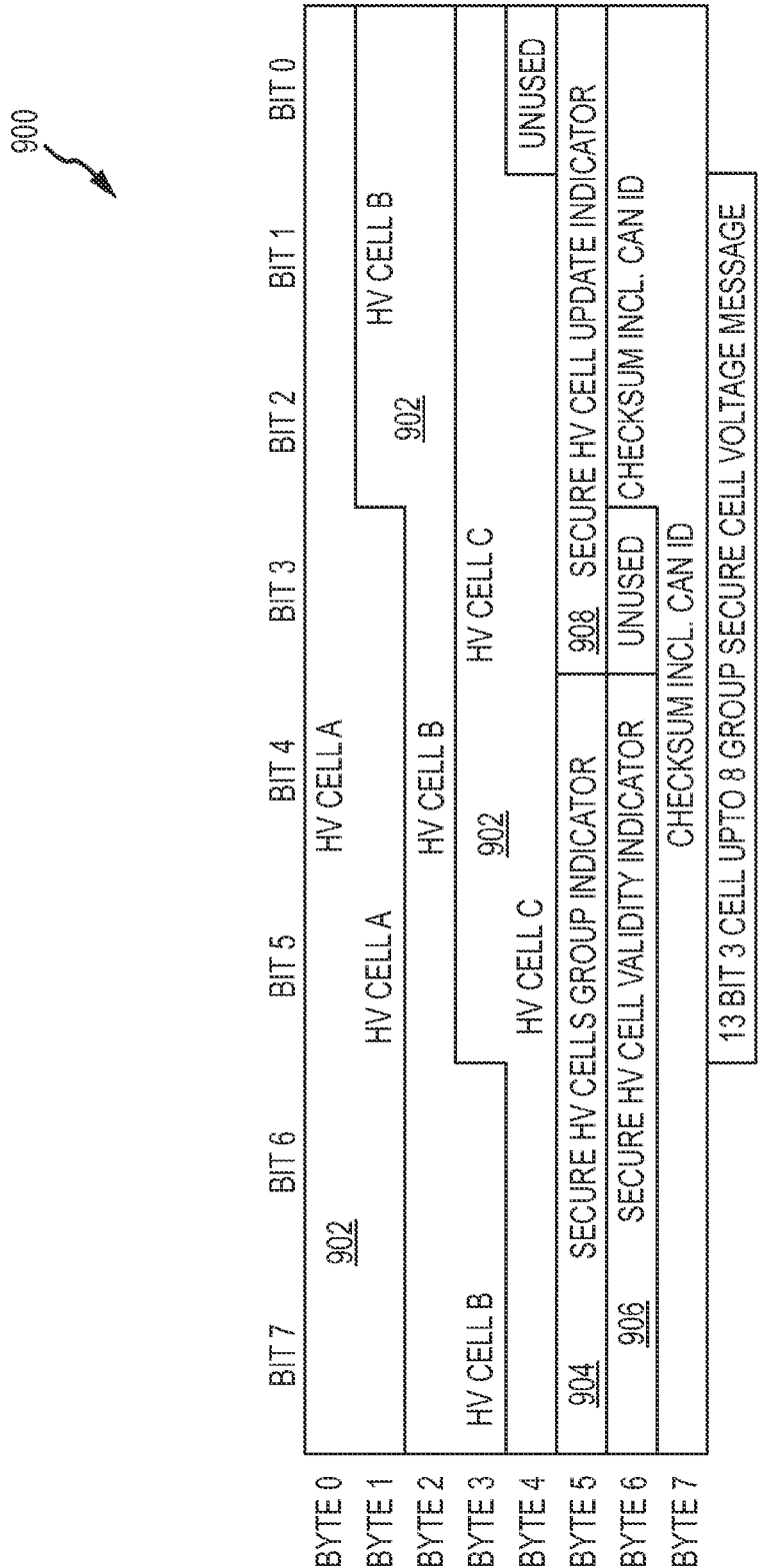
FIG. 9 is a functional block diagram depicting an encoded data message that can be encoded during the step of FIG. 4, in accordance with an exemplary embodiment of the present invention.
Figure 10:
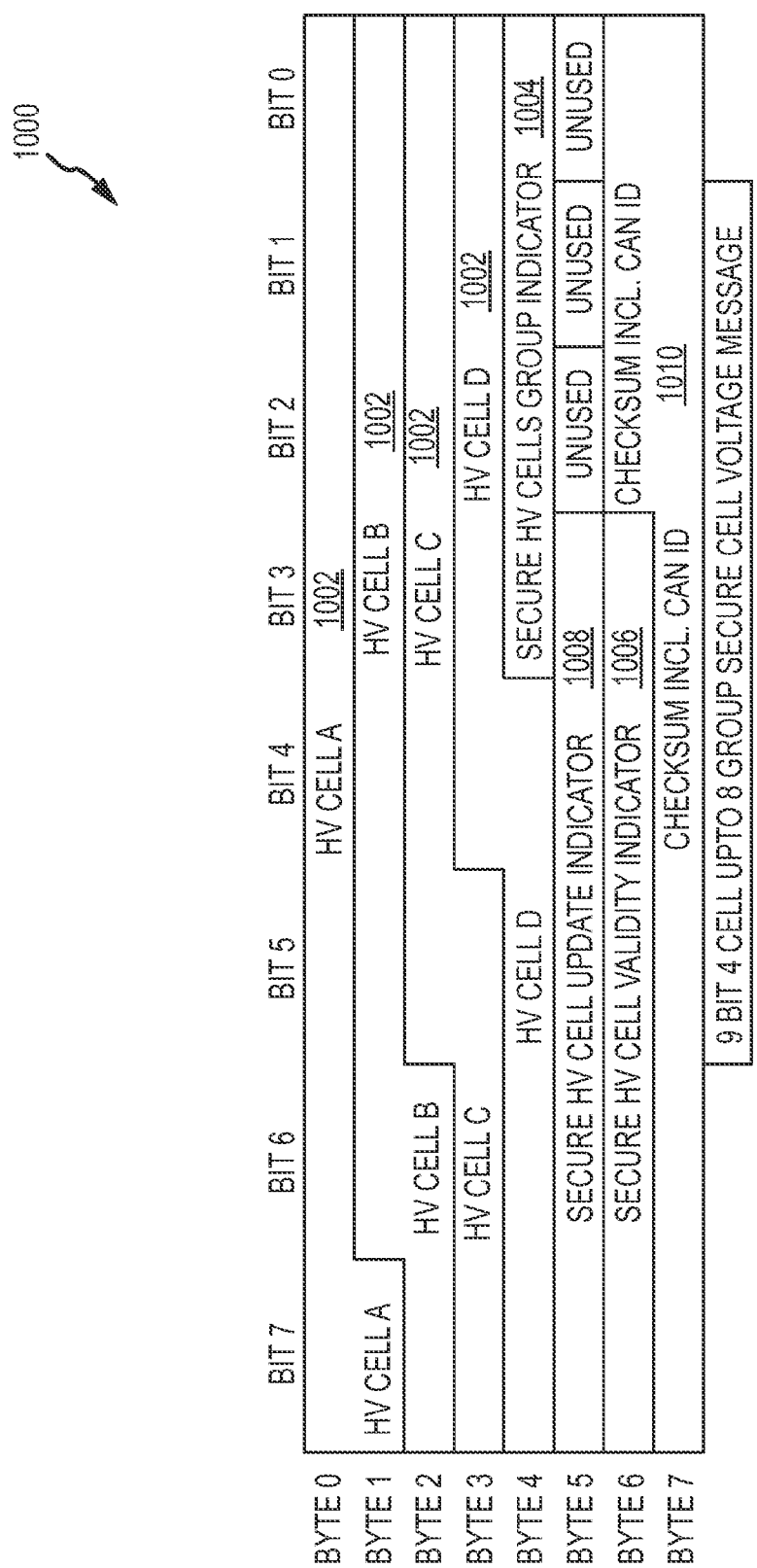
FIG. 10 is a functional block diagram depicting an alternative encoded data message that can be encoded during the step of FIG. 4, in accordance with an exemplary embodiment of the present invention.

Next, the data message is prepared for transmittal (step 430). In a preferred embodiment, the data message includes the voltage values for the voltage group, as well as the group validity measure, the group update measure, the complementary validity values, the complementary update values, the message identification, and the modified checksum. For example, FIG. 9 depicts an exemplary data message 900 for a voltage group representing three battery cells (Cell A, Cell B, and Cell C). The exemplary data message 900 includes three voltage values 902 (one for each of the battery cells in the voltage group), an indicator 904 indicative of the data message and/or the voltage group represented therein, a group validity indicator 906, a group update indicator 908, and a modified checksum 910. Similarly, FIG. 10 depicts an exemplary data message 1000 for a voltage group representing four battery cells (Cell A, Cell B, Cell C, and Cell D). The exemplary data message 1000 includes four voltage values 1002 (one for each of the battery cells in the voltage group), an indicator 1004 indicative of the data message and/or the voltage group represented therein, a group validity indicator 1006, a group update indicator 1008, and a modified checksum 1010.

Once the data message is prepared for transmittal, the process of FIG. 4 continues with the step of determining whether there are any additional voltage groups in a sequence of voltage groups (step 432). If it is determined that there are one or more additional voltage groups in the sequence, then an additional voltage group is selected (step 434), the index is incremented accordingly (step 436), and then steps 410-432 repeat in a new iteration for this additional voltage group. Steps 410-432 repeat in this manner through various iterations until a determination is made in an iteration of step 432 that there are no additional voltage groups in the sequence.

Once it is determined in an iteration of step 432 that there are no additional voltage groups in the sequence, then the sequence begins again. Specifically, the process returns to the first group that was initially selected in step 407 (step 438), and the index is reset accordingly (step 440). Then steps 410-432 repeat for a new sequence, beginning with this initial voltage group. In a preferred embodiment, encoded data messages are continuously prepared in sequence in accordance with this process. In such a preferred embodiment, the various resulted encoded data messages each pertain to voltage values for a different voltage group, and are spaced apart continuously over time.

For example, in one exemplary embodiment, a new encoded data message is generated in this manner and transmitted along the data connection 110 of FIG. 1 every 250 milliseconds, so that the respective data messages for the various voltage groups are spaced apart accordingly, in a continuous, repeated loop with continuously updated values. For example, a data message pertaining to a first voltage group may be transmitted after 250 milliseconds, a data message pertaining to a second voltage group may be transmitted after 500 milliseconds, and so forth. Once data messages have been transmitted pertaining to each of the voltage groups in the sequence, then the sequence is repeated. Specifically, new, updated data messages are then generated and transmitted for each voltage group in the sequence, beginning again with the first voltage group, for example with a new data message being transmitted every 250 milliseconds. The process preferably repeats in this manner so long as the voltage values are needed. While it will be appreciated that the timing and spacing of the data messages may vary in different embodiments, the general timing and spacing of messages (regardless of the number of voltage groups and/or the amount of time between each data message) such as that described above can be advantageous, for example in reducing the number and/or size of data messages being transmitted simultaneously through the data connection 110.

Accordingly, an improved method has been provided for encoding information regarding battery cell voltages in a hybrid vehicle that provides improved encoding and/or that does not significantly increase the size and/or number of messages transmitted along the vehicle bus. In addition, an improved program has been provided for encoding information regarding battery cell voltages in a hybrid vehicle, for example that provides improved encoding and/or that does not significantly increase the size and/or number of messages transmitted along the vehicle bus. It will be appreciated that the processes and programs described herein may vary in certain embodiments. It will similarly be appreciated that various steps of the processes and programs described herein may be performed simultaneously and/or in a different order than that presented in the figures and/or described herein, and that the methods and programs described herein may also be utilized and/or implemented in connection with any number of other different types of devices, systems, processes, and/or programs.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of encoding vehicle data comprising a first voltage pertaining to a first battery cell and a second voltage pertaining to a second battery cell, the method comprising the steps of:
    determining whether the first voltage is valid;
    determining whether the second voltage is valid; and
    assigning one of a plurality of values to a validity measure based at least in part on whether the first voltage or the second voltage, or both, are valid;
    wherein the plurality of values, in binary form, are at least two bit errors removed from one another.

2. The method of claim 1, further comprising the step of:
    generating a message comprising the first voltage, the second voltage, and the validity measure.

3. The method of claim 2, further comprising the step of:
    transmitting the message.

4. The method of claim 1, wherein the vehicle data further comprises a third voltage pertaining to a third battery cell, and the step of assigning one of the plurality of values to the validity measure comprises the steps of:
    assigning a first value of the plurality of values to the validity measure if the first voltage, the second voltage, and the third voltage each are valid;
    assigning a second value of the plurality of values to the validity measure if the first voltage and the second voltage each are valid and the third voltage is invalid;
    assigning a third value of the plurality of values to the validity measure if the first voltage and the third voltage each are valid and the second voltage is invalid;
    assigning a fourth value of the plurality of values to the validity measure if the second voltage and the third voltage each are valid and the first voltage is invalid;
    assigning a fifth value of the plurality of values to the validity measure if the second voltage and the third voltage each are invalid and the first voltage is valid;
    assigning sixth value of the plurality of values to the validity measure if the first voltage and the third voltage each are invalid and the second voltage is valid;
    assigning a seventh value of the plurality of values to the validity measure if the first voltage and the second voltage each are invalid and the third voltage is valid; and
    assigning an eighth value of the plurality of values to the validity measure if the first voltage, the second voltage, and the third voltage each are invalid;
    wherein the first value, the second value, the third value, the fourth value, the fifth value, the sixth value, the seventh value, and the eighth value of the plurality of values each are, in binary form, at least two bit errors removed from one another.

5. The method of claim 1, further comprising the steps of:
    determining whether the first voltage is current;
    determining whether the second voltage is current; and
    assigning one of a second plurality of values to an update measure based at least in part on whether the first voltage or the second voltage, or both, are current;
    wherein the second plurality of values, in binary form, are at least two bit errors removed from one another.

6. The method of claim 5, wherein the vehicle data further comprises a third voltage pertaining to a third battery cell, and the step of assigning one of the second plurality of values to the update measure comprises the steps of:

assigning a first value of the second plurality of values to the update measure if the first voltage is current, the second voltage is current, and the third voltage of the voltage group is current;
assigning a second value of the second plurality of values to the update measure if the first voltage is current, the second voltage is current, and the third voltage is not current;
assigning a third value of the second plurality of values to the update measure if the first voltage is current, the second voltage is not current, and the third voltage is current;
assigning a fourth value of the second plurality of values to the update measure if the first voltage is not current, the second voltage is current, and the third voltage is current;
assigning a fifth value of the second plurality of values to the update measure if the first voltage is current, the second voltage is not current, and the third voltage is not current;
assigning a sixth value of the second plurality of values to the update measure if the first voltage is not current, the second voltage is not current, and the third voltage is current;
assigning a seventh value of the second plurality of values to the update measure if the first voltage is not current, the second voltage is current, and the third voltage is not current; and
assigning an eighth value of the second plurality of values to the update measure if the first voltage is not current, the second voltage is not current, and the third voltage is not current;
wherein the first value, the second value, the third value, the fourth value, the fifth value, the sixth value, the seventh value, and the eighth value of the second plurality of values each are, in binary form, at least two bit errors removed from one another.

7. The method of claim 6, further comprising the step of:
generating a message comprising the first voltage, the second voltage, the third voltage, the validity measure, and the update measure.

8. A program product for encoding vehicle data comprising a first voltage pertaining to a first battery cell and a second voltage pertaining to a second battery cell, the program product comprising:
a program configured to at least facilitate:
determining whether the first voltage is valid;
determining whether the second voltage is valid; and
assigning one of a plurality of values to a validity measure based at least in part on whether the first voltage or the second voltage, or both, are valid, wherein the plurality of values, in binary form, are at least two bit errors removed from one another; and
a non-transitory, computer-readable storage medium storing the program.

9. The program product of claim 8, wherein the program is further configured to at least facilitate:
generating a message comprising the first voltage, the second voltage, and the validity measure.

10. The program product of claim 8, wherein the vehicle data further comprises a third voltage pertaining to a third battery cell, and wherein the program is further configured to at least facilitate:
assigning a first value of the plurality of values to the validity measure if the first voltage, the second voltage, and the third voltage each are valid;
assigning a second value of the plurality of values to the validity measure if the first voltage and the second voltage each are valid and the third voltage is invalid;
assigning a third value of the plurality of values to the validity measure if the first voltage and the third voltage each are valid and the second voltage is invalid;
assigning a fourth value of the plurality of values to the validity measure if the second voltage and the third voltage each are valid and the first voltage is invalid;
assigning a fifth value of the plurality of values to the validity measure if the second voltage and the third voltage each are invalid and the first voltage is valid;
assigning sixth value of the plurality of values to the validity measure if the first voltage and the third voltage each are invalid and the second voltage is valid;
assigning a seventh value of the plurality of values to the validity measure if the first voltage and the second voltage each are invalid and the third voltage is valid; and
assigning an eighth value of the plurality of values to the validity measure if the first voltage, the second voltage, and the third voltage each are invalid;
wherein the first value, the second value, the third value, the fourth value, the fifth value, the sixth value, the seventh value, and the eighth value of the plurality of values each are, in binary form, at least two bit errors removed from one another.

11. The program product of claim 8, wherein the program is further configured to at least facilitate:
determining whether the first voltage is current;
determining whether the second voltage is current; and
assigning one of a second plurality of values to an update measure based at least in part on whether the first voltage or the second voltage, or both, are current;
wherein the second plurality of values, in binary form, are at least two bit errors removed from one another.

12. The program product of claim 11, wherein the vehicle data further comprises a third voltage pertaining to a third battery cell, and the program is further configured to at least facilitate:
assigning a first value of the second plurality of values to the update measure if the first voltage is current, the second voltage is current, and the third voltage of the voltage group is current;
assigning a second value of the second plurality of values to the update measure if the first voltage is current, the second voltage is current, and the third voltage is not current;
assigning a third value of the second plurality of values to the update measure if the first voltage is current, the second voltage is not current, and the third voltage is current;
assigning a fourth value of the second plurality of values to the update measure if the first voltage is not current, the second voltage is current, and the third voltage is current;
assigning a fifth value of the second plurality of values to the update measure if the first voltage is current, the second voltage is not current, and the third voltage is not current;
assigning a sixth value of the second plurality of values to the update measure if the first voltage is not current, the second voltage is not current, and the third voltage is current;
assigning a seventh value of the second plurality of values to the update measure if the first voltage is not current, the second voltage is current, and the third voltage is not current; and assigning an eighth value of the second plurality of values to the update measure if the first voltage is not current, the second voltage is not current, and the third voltage is not current;

wherein the first value, the second value, the third value, the fourth value, the fifth value, the sixth value, the seventh value, and the eighth value of the second plurality of values each are, in binary form, at least two bit errors removed from one another.

13. The program product of claim 12, wherein the program is further configured to at least facilitate:

generating a message comprising the first voltage, the second voltage, the third voltage, the validity measure, and the update measure.

14. A system for encoding vehicle data comprising a first voltage pertaining to a first battery cell and a second voltage pertaining to a second battery cell, the system comprising:

a measurement unit configured to obtain the first voltage and the second voltage; and a processor coupled to the measurement unit and configured to at least facilitate:
determining whether the first voltage is valid;
determining whether the second voltage is valid; and
assigning one of a plurality of values to a validity measure based at least in part on whether the first voltage or the second voltage, or both, are valid, wherein the plurality of values, in binary form, are at least two bit errors removed from one another.

15. The system of claim 14, wherein the processor is further configured to at least facilitate:

generating a message comprising the first voltage, the second voltage, and the validity measure.

16. The system of claim 14, wherein the processor is further configured to at least facilitate:

transmitting the message.

17. The system of claim 14, wherein:
the vehicle data further comprises a third voltage pertaining to a third battery cell;
the measurement unit is configured to obtain the third voltage; and
the processor is further configured to at least facilitate:
assigning a first value of the plurality of values to the validity measure if the first voltage, the second voltage, and the third voltage each are valid;
assigning a second value of the plurality of values to the validity measure if the first voltage and the second voltage each are valid and the third voltage is invalid;
assigning a third value of the plurality of values to the validity measure if the first voltage and the third voltage each are valid and the second voltage is invalid;
assigning a fourth value of the plurality of values to the validity measure if the second voltage and the third voltage each are valid and the first voltage is invalid;
assigning a fifth value of the plurality of values to the validity measure if the second voltage and the third voltage each are invalid and the first voltage is valid;
assigning sixth value of the plurality of values to the validity measure if the first voltage and the third voltage each are invalid and the second voltage is valid;
assigning a seventh value of the plurality of values to the validity measure if the first voltage and the second voltage each are invalid and the third voltage is valid; and
assigning an eighth value of the plurality of values to the validity measure if the first voltage, the second voltage, and the third voltage each are invalid;

wherein the first value, the second value, the third value, the fourth value, the fifth value, the sixth value, the seventh value, and the eighth value of the plurality of values each are, in binary form, at least two bit errors removed from one another.

18. The system of claim 14, wherein the processor is further configured to at least facilitate:
determining whether the first voltage is current;
determining whether the second voltage is current; and
assigning one of a second plurality of values to an update measure based at least in part on whether the first voltage or the second voltage, or both, are current;
wherein the second plurality of values, in binary form, are at least two bit errors removed from one another.

19. The system of claim 18, wherein:
the vehicle data further comprises a third voltage pertaining to a third battery cell;
the measurement unit is configured to obtain the third voltage; and
the processor is further configured to at least facilitate:
assigning a first value of the second plurality of values to the update measure if the first voltage is current, the second voltage is current, and the third voltage of the voltage group is current;
assigning a second value of the second plurality of values to the update measure if the first voltage is current, the second voltage is current, and the third voltage is not current;
assigning a third value of the second plurality of values to the update measure if the first voltage is current, the second voltage is not current, and the third voltage is current;
assigning a fourth value of the second plurality of values to the update measure if the first voltage is not current, the second voltage is current, and the third voltage is current;
assigning a fifth value of the second plurality of values to the update measure if the first voltage is current, the second voltage is not current, and the third voltage is not current;
assigning a sixth value of the second plurality of values to the update measure if the first voltage is not current, the second voltage is not current, and the third voltage is current;
assigning a seventh value of the second plurality of values to the update measure if the first voltage is not current, the second voltage is current, and the third voltage is not current; and
assigning an eighth value of the second plurality of values to the update measure if the first voltage is not current, the second voltage is not current, and the third voltage is not current;
wherein the first value, the second value, the third value, the fourth value, the fifth value, the sixth value, the seventh value, and the eighth value of the second plurality of values each are, in binary form, at least two bit errors removed from one another.

20. The system of claim 19, wherein the processor is further configured to at least facilitate:
generating a message comprising the first voltage, the second voltage, the third voltage, the validity measure, and the update measure.

* * * * *